(12) United States Patent
Burgin (10) Patent No.: US 6,298,096 B1
(45) Date of Patent: Oct. 2, 2001

(54) METHOD AND APPARATUS FOR DETERMINATION OF PREDISTORTION PARAMETERS FOR A QUADRATURE MODULATOR

(75) Inventor: George H. Burgin, La Jolla, CA (US)

(73) Assignee: Titan Corporation, DE (US)

( * ) Notice: Subject to any disclaimer, the term of this patent is extended or adjusted under 35 U.S.C. 154(b) by 0 days.

(21) Appl. No.: 09/196,361

(22) Filed: Nov. 19, 1998

(51) Int. Cl.$^7$ .............................. H04K 1/02; H04L 25/03; H04L 25/49
(52) U.S. Cl. ........................... 375/296; 330/149; 332/123
(58) Field of Search ................................... 375/296, 297, 375/285, 254; 330/149; 332/123

(56) References Cited

U.S. PATENT DOCUMENTS

| | | | |
|---|---|---|---|
| 5,049,832 | * 9/1991 | Cavers | 330/149 |
| 5,355,101 | 10/1994 | Ichihara et al. . | |
| 5,422,889 | 6/1995 | Sevenhans et al. . | |
| 5,432,483 | 7/1995 | Maru et al. . | |
| 5,450,043 | 9/1995 | Tanaka et al. . | |
| 5,524,285 | 6/1996 | Wray et al. | 455/126 |
| 5,604,929 | 2/1997 | Loper et al. . | |
| 5,613,226 | 3/1997 | Kanami . | |
| 5,705,958 | 1/1998 | Janer . | |
| 5,732,333 | 3/1998 | Cox et al. . | |
| 5,740,520 | * 4/1998 | Cyze et al. | 455/69 |
| 5,786,728 | * 7/1998 | Alinikula | 330/149 |
| 6,072,364 | * 6/2000 | Jeckeln et al. | 330/149 |

OTHER PUBLICATIONS

Lohtia et al., *Can. J. Elect. & Comp. Eng.*, 20(2): 65–71, 1995, "Adaptive digital linearization of RF power amplifiers."

Stapleton, S. S Costescu, F., *IEEE Transactions on Vehicular Technology*, 41(1): 49–56, Feb. 1992, "An Adaptive Predistorter for a Power Amplifier Based on Adjacent Channel Emissions."

Cavers, J.K. (1990) Amplifier linearization using a digital predistorter with fast adaptation and low memory requirements. IEEE Transactions on Vehicular Tech. 39:4 374–382.

(List continued on next page.)

*Primary Examiner*—Stephen Chin
*Assistant Examiner*—Lenny Jiang
(74) *Attorney, Agent, or Firm*—Knobbe, Martens Olson & Bear LLP (57) ABSTRACT

A transmit modulator which uses a quadrature modulator has a predistortion block which produces a predistorted output signal. The predistortion block pre-compensates for errors introduced by the quadrature modulator based on a set of predistortion parameters. The quadrature modulator receives the output signals from the predistortion block. The quadrature modulator up-converts the I and Q channel signals and combines them. In the process, the quadrature modulator introduces errors. In calibration mode, a sinusoidal wave at frequency $f_{cal}$ is applied to the input of the predistortion block and a transformer is coupled to the output of the quadrature modulator. The transformer produces a digital representation of a spectrum of the output of the quadrature modulator converted to baseband. Spurious energy produced by the quadrature modulator errors but reduced by the effect of the predistortion block is generated at $f_{cal}$ and $2*f_{cal}$. A quadratic polynomial minimization calculator receives the output of the transformer. The quadratic polynomial minimization calculator determines a subsequent value of the predistortion parameters based upon a quadratic relationship between energies present in the digital representation of the spectrum of the output of the quadrature modulator at frequencies $f_{cal}$ and $2*f_{cal}$ and the values of the previous predistortion parameters.

12 Claims, 3 Drawing Sheets

OTHER PUBLICATIONS

Crozier, S., et al. (1993) Direct digital RF synthesis and modulation for MSAT mobile applications. NASA–CR–194516 Proceedings of the third International Mobile Satellite Conference. N94–22804 399–403.

Datta, R., et al. (1995) Direct modulation at L–Band using a quadrature modulator with feedback. International Mobile Satellite Conference, Ottawa 383–388.

Faulkner, M., et al. (1991) Automatic adjustment of quadrature modulators. Electronics Letters 27:3 214–216.

Hilborn, D.S., et al. (1994) An adaptive direct conversion transmitter. IEEE Transactions on Vehicular Technology 43:2 223–233.

Roome, S.J. (1989) Analysis of quadrature detectors using complex envelope. IEE Proceedings 136:Pt.F, No. 2 95–100.

Stapleton, S.P. (1992) Simulation and analysis of an adaptive predistorter utilizing a complex spectral convolution. IEEE Transactions on Vehicular Technology 41:4 387–394.

* cited by examiner

METHOD AND APPARATUS FOR DETERMINATION OF PREDISTORTION PARAMETERS FOR A QUADRATURE MODULATOR

BACKGROUND OF THE INVENTION

I. Field of the Invention

This invention relates generally to wireless transmitters. More specifically, the invention relates to quadrature modulation of a transmission signal in a wireless transmitter.

II. Description of the Related Art

Modern digital communications systems often use quadrature techniques to impress data on a modulated signal. The use of quadrature techniques allows twice as much data to be transferred within the same bandwidth compared to single-phase modulation techniques. Quadrature techniques can be applied in many types of systems using a variety of modulation and access techniques. For example, quadrature techniques can be applied in code division multiple access (CDMA), time division multiple access (TDMA) and frequency division multiple access (FDMA) systems as well as others. Using quadrature techniques, at the transmitter, a quadrature modulator impresses a portion of the signal energy on an in-phase (I) channel and the remainder on a quadrature (Q) channel which is 90 degrees out of phase in comparison with the I channel. At the receiver, the energy from each channel can be separately recovered by a quadrature demodulator.

In many modern wireless communication systems, the cost of the remote communication unit is a substantial barrier to extensive deployment. For example, in a satellite based, wireless local loop telephone system, the cost of the handset to the end consumer can be a major factor in determining the penetration into the market which the wireless service will enjoy. For this reason, considerable effort to techniques has been expended in recent years revolutionize remote unit architectures so that they cost less.

In a typical wireless transmitter, a digital representation of a baseband signal is generated by digital circuitry. An analog to digital converter (A/D) is used to convert the digital representation to a baseband analog signal. The baseband signal is upconverted from baseband to a fixed intermediate frequency (IF) where a variety of signal processing functions are applied. For example, the gain of the signal can be set to accommodate current system conditions. The signal can be subjected to rigorous filtering in order to reduce transmission spurs. The conditioned IF signal is converted to a channel sensitive transmission radio frequency (RF). The RF signal is transmitted over the wireless link.

The main issues in designing a quadrature modulator are maintenance of quadrature phase between the I and Q channel, minimization of differential gain errors and differential direct current (D.C.) offsets between the I and Q channels as well as minimization of carrier leakage. Each of these factors can cause spurious output power to be generated which can interfere with the transmitted signal as well as signals in adjacent bands. In addition, each of these factors can introduce distortion into the transmitted signal which can result in an increased bit-error rate (BER) at the receiver and an undesired spreading of the signal spectrum. In practical circuit designs, these factors vary with temperature, device biasing, component aging and frequency, often making readjustment during operation necessary. In addition to baseband signal processing, IF signal processing can be used to accommodate for some of these errors.

In order to reduce the cost of the remote unit, the luxury of using IF techniques is no longer economically practical in many situations. Alternatively, modern communication transmitters have begun to use direct conversion techniques which provide for the direct conversion of a baseband signal to a radio frequency signal. Direct conversion systems are characterized by the use of a single up-conversion stage using a high-frequency quadrature modulator.

To construct a high frequency, direct conversion circuit, it is necessary to mount many extremely small devices on a single semiconductor chip substrate. These devices are closely packed together and, further, because of their size, are extremely sensitive to stray currents. Because of the dense packing and the associated network of interlaced wires, the circuits are susceptible to crosstalk between the various components. This crosstalk is primarily due to capacitive coupling between adjacent wires, but may also result from inductive coupling and transmission line effects. In addition, D.C. offsets and gains realized even on adjacent signal paths on a single substrate can vary significantly. Although through careful circuit design and layout these factors can be controlled, the unpredictability of extremely complex systems results in random variations in these factors from path to path, from part to part and from assembled system to assembled system.

Figure 1A:
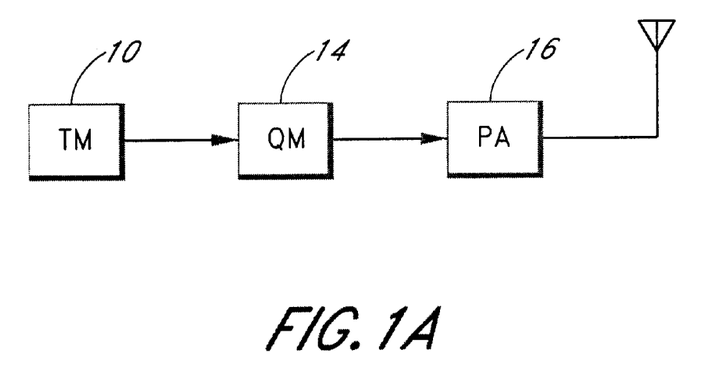
FIG. 1A is a block diagram illustrating a basic direct conversion transmitter.

Despite these design challenges, direct conversion architectures provide several desirable features. For example, direct conversion techniques tend to require less circuitry leading to a higher efficiency and reduced D.C. power requirements. Direct conversion transmitters are typically less costly to manufacture and smaller in size than conventional systems. FIG. 1A is a block diagram illustrating a basic direct conversion transmitter. As shown, a transmit modem (TM) 10 feeds a quadrature modulator (QM) 14 which in turn drives a power amplifier (PA) 16. The transmit modem 10 generates the complex baseband information signals. The quadrature modulator 14 provides direct conversion of the combined complex baseband information signals to the RF transmit frequency. The power amplifier 16 amplifies the RF signal for transmission over the wireless link.

Because a direct conversion system is very sensitive to quadrature modulator gain imbalance, phase imbalance and D.C. offsets, careful control over quadrature modulator errors is required. If quadrature modulator errors were more or less static, then, a simple calibration of the phase, gain, and offset errors would suffice. However, as noted above, the quadrature modulator errors can be expected to change with temperature, channel frequency, device biasing and component aging, and, thus, some means of "tracking" the quadrature modulator errors is needed.

Several error correction techniques have been studied in the literature such as Cartesian feedback, feedforward and predistortion. Using predistortion, the baseband signal is passed through a nonlinear system having an inverse characteristic compared to those of the quadrature modulator causing the overall system to be linear.

Figure 1B:
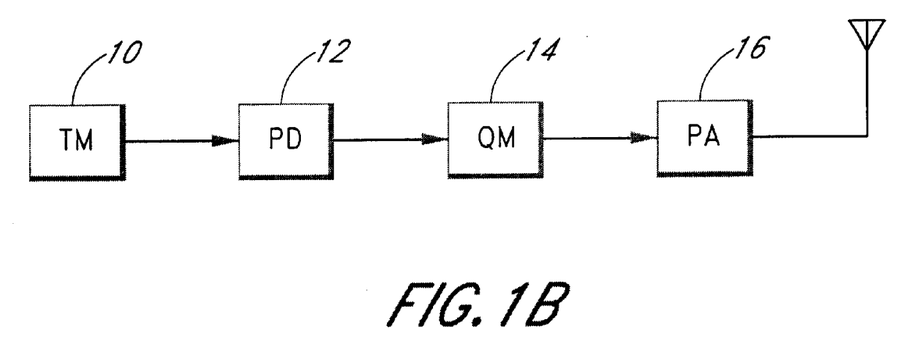
FIG. 1B is a block diagram illustrating a basic direct conversion transmitter which incorporates predistortion.

FIG. 1B is a block diagram illustrating a basic direct conversion transmitter which incorporates predistortion. In comparison with FIG. 1A, a predistorter 12 has been inserted between the transmit modem 10 and the quadrature modulator 14. Ideally, the predistorter 12 exhibits the inverse transfer function of the undesired characteristics of the quadrature modulator 14. The transmit modem 10 generates the complex baseband information signal which is then pre-corrected in the predistorter 12 to compensate for anticipated errors which will be introduced by the quadrature modulator 14.

Several approaches have been used to determine the value of the transfer function of the predistorter. In J. K. Cavers, "A Linearizing Predistorter with Fast Adaptation," *IEEE Trans. Vehicular Technology*, vol. 39, no. 4, pp. 374–382, November 1990, a look-up table having input power as the index and complex gain as the table entries is used. The table look-up method can be used to fit any gain profile, and performance can be adjusted by increasing or decreasing the table size. The second approach, as detailed in S. P. Stapleton, G. S. Kandola, and J. K. Cavers, "Stimulation and Analysis of an Adaptive Predistorter Utilizing a Complex Spectral Convolution," *IEEE Trans. Vehicular Technology*, vol. 41, no. 4, pp. 387–394, November 1992., uses two polynomial equations to fit the desired complex gain curves. This method is simpler to implement, but arbitrary gain profiles may be difficult to fit with polynomial functions. The polynomial method, because it has fewer variables, is also easier to initialize and update than the table look-up method.

A binary search is proposed by R. Datta and S. N. Crozier, "Direct Modulation at L-Band using a Quadrature Modulator with Feedback," International Mobile Satellite Conference, Ottawa (IMSC'95) pp. 383–388. The binary search is used to find the predistortion parameters by the measurement of energies at two or more frequencies during the calibration process. The binary search method is an iterative process which continues until the process converges on an acceptable value. The iterative nature of the binary search process can consume a significant amount of system resources and require significant amount of time. In addition, the binary search algorithm converges to the correct solution only if the correct solution is within the initial range of uncertainty.

Each of the prior art methods requires a substantial amount of processing power and can be exceedingly difficult to implement. In addition, they may each require a substantial amount of time to converge upon the optimal values and may not be robust under certain operating conditions.

Therefore, there has been a need in the industry, to develop a robust and reliable determination of predistortion parameters which does not consume an excessive amount of processing power.

SUMMARY OF THE INVENTION

A transmit modulator which uses a quadrature modulator has a predistortion block which produces a predistorted output signal. The predistortion block pre-compensates for errors introduced by the quadrature modulator. The predistortion block comprises a D.C. offset compensation summer which determines a D.C. offset adjustment to an I channel signal path based upon a predistortion parameter, $b_i$. The predistortion block also has a D.C. offset compensation summer which determines a D.C. offset adjustment to a Q channel signal path based upon a predistortion parameter, $b_q$. The predistortion block also has a crosstalk amplifier which determines a crosstalk gain between the I channel and the Q channel signal path based upon a predistortion parameter, K. The predistortion block also has a gain compensation amplifier which determines a gain offset adjustment between the I channel signal path and the Q channel signal path based upon a predistortion parameter, G.

The quadrature modulator receives the output signals from the predistortion block. The quadrature modulator up-converts the I and Q channel signals and combines them. In the process, the quadrature modulator introduces errors. These errors create spurious energy.

In calibration mode, a sinusoidal wave at frequency $f_{cal}$ is applied to the input of the predistortion block and a transformer is coupled to the output of the quadrature modulator. The transformer produces a digital representation of a spectrum of the output of the quadrature modulator converted to baseband. Spurious energy produced by the quadrature modulator errors but reduced by the effect of the predistortion block is generated at $f_{cal}$ and $2*f_{cal}$.

A quadratic polynomial minimization calculator receives the output of the transformer. The quadratic polynomial minimization calculator determines a subsequent value of the predistortion parameters, $b_i$, $b_q$, K and G based upon a quadratic relationship between energies present in the digital representation of the spectrum of the output of the quadrature modulator at frequencies $f_{cal}$ and $2*f_{cal}$ and the values of the predistortion parameter b, b, K and G.

BRIEF DESCRIPTION OF THE DRAWINGS

The features, objectives, and advantages of the invention will become more apparent from the detailed description set forth below when taken in conjunction with the drawings wherein like parts are identified with like reference numerals throughout and wherein.

DETAILED DESCRIPTION OF THE INVENTION

It is known from basic quadrature modulator theory that output spurs are created by the error introduced by a quadrature modulator. It is also known that the energy at the spur frequencies is essentially defined as a quadratic function of those errors. For this reason, the energy at the spur frequencies is also defined by a quadratic function of any predistortion parameters which are applied before quadrature modulation. The prior art does not exploit this knowledge in the predistortion parameter determination process. The invention uses this knowledge to develop an efficient, iterative process which is easy to implement and which converges reliably under many conditions. The invention fits a quadratic polynomial to the measured energy at several spur frequencies and, then, finds the abscissa value at which this polynomial assumes an extremum. From theory, we know that this extremum must be a minimum. This process can be executed iteratively until sufficient convergence is obtained.

Figure 2:
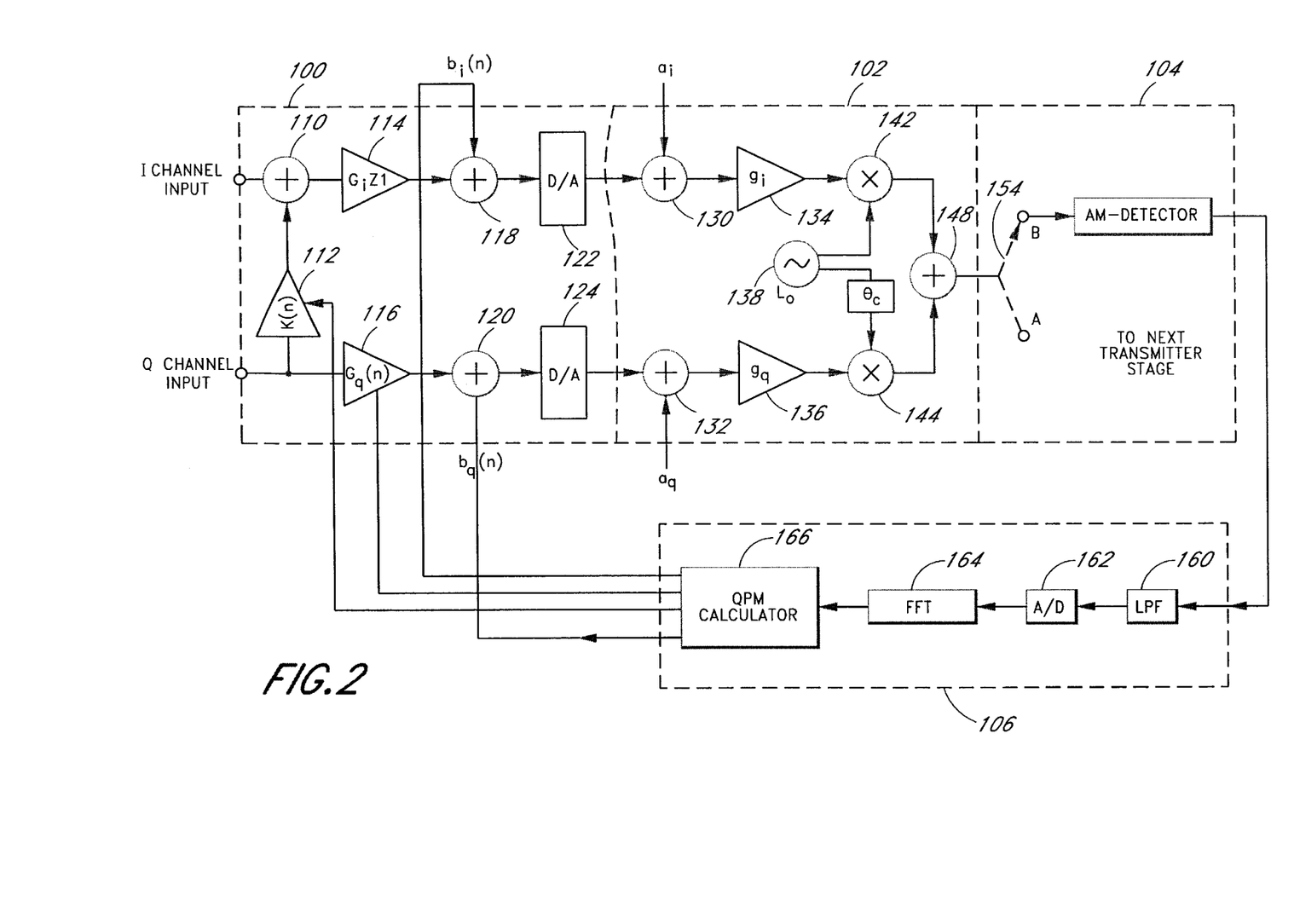
FIG. 2 is a block diagram showing a predistortion quadrature modulator incorporating the invention.

FIG. 2 is a block diagram showing one embodiment of a predistortion quadrature modulator incorporating the invention. The predistortion quadrature modulator shown in FIG. 2 performs direct modulation of a signal at the frequency of transmission. The predistortion quadrature modulator of FIG. 2 operates in one of two modes. The first mode is a transmission mode in which the signals to be transmitted are modulated according to normal operation and transmitted over a wireless link. In transmission mode, the circuit uses the previously determined predistortion parameters. The second mode is a calibration mode in which no signal is being transmitted. During calibration mode, the predistortion parameters are determined. In a TDMA system, calibration mode can be active between the transmission slots. In a FDMA, CDMA or TDMA system, calibration mode can be active between transmission bursts.

The predistortion quadrature modulator shown in FIG. 2 is comprised of four blocks. A digital predistortion block 100 pre-compensates the baseband transmission or calibration mode signals and converts them to analog form. A quadrature modulation block 102 represents the quadrature modulator including the imperfections which it introduces. In calibration mode, an amplitude modulation (AM) detection block 104 uses an AM detection process to generate a baseband analog signal. In transmission mode, the AM detection block 104 simply passes the transmission signal to the next stage. In calibration mode, a parameter determination block 106 collects a series of data samples and executes a series of calculations in order to determine a set of predistortion parameters for use in subsequent transmission mode operation.

In transmission mode, the input to the digital predistortion block 100 is the I channel and Q channel signals in baseband digitized form. In calibration mode, the input to the digital predistortion block 100 is a digitized sinusoidal wave at a frequency $f_{cal}$. The digital predistortion block 100 contains four adjustable elements which are used to pre-compensate for errors introduced by circuit imperfections as representatively shown in the quadrature modulation block 102 in FIG. 2. During transmission mode, the adjustable elements are set according to the predistortion parameters most recently determined. In calibration mode, the settings of the four adjustable elements are varied over a series of values in order to determine a new set of predistortion parameters for use during a subsequent transmission mode.

The Q channel input is coupled to the input of a crosstalk amplifier 112. The I channel input is coupled to a summer 110 which sums the I channel input with the output of the crosstalk amplifier 112. The gain of the crosstalk amplifier 112 is determined by the predistortion parameter K. The cross talk amplifier 112 couples a small portion of the Q channel signal into the I channel signal path to pre-compensate for cross talk imperfections. Crosstalk may also be modeled as a phase shift of I channel signal path relative to the Q channel signal path. The crosstalk amplifier 112 can also be implemented by coupling a portion of the I channel signal into the Q channel path in an alternative embodiment.

The output of the summer 110 is coupled to a unity gain amplifier 114. The Q channel input is coupled to a gain predistortion amplifier 116. The gain of the gain predistortion amplifier 116 is determined by the predistortion parameter $G_q$. Because it is only necessary to balance the relative gain between the I channel and the Q channel paths, it is only necessary to compensate the gain of one of the signal paths. In this case, the Q channel is arbitrarily selected to comprise the gain predistortion amplifier 116.

The output of the unity gain amplifier 114 and the gain predistortion amplifier 116 are coupled to a D.C. offset predistortion summer 118 and a D.C. offset predistortion summer 120 respectively. The D.C. offset predistortion summer 118 sums a D.C. offset signal determined by the predistortion parameter $b_i$. The D.C. offset predistortion summer 120 sums a D.C. offset signal determined by the predistortion parameter $b_q$. The output of the D.C. offset gain predistortion summers 118 and 120 are coupled to digital-to-analog (D/A) converters 122 and 124, respectively. The D/A converters 122 and 124 produce low frequency or baseband analog signals which are coupled to the quadrature modulation block 102.

The quadrature modulation block 102 is comprised of several actual circuit elements as well as a set of representative elements which represent the errors introduced within a quadrature modulator. These representative elements illustrate the introduction of undesirable offsets, ingresses and imbalances due to circuit imperfections. These representative elements are not actual circuit elements which would be found in an actual implementation, but are, instead, representations of the undesirable effects added to the figure in order to facilitate an understanding of the predistortion mechanism. In the quadrature modulation block 102, a representative summer 130, a representative summer 132, a representative amplifier 134, a representative amplifier 136 and a representative phase shifter 140 each illustrate an error introduced by the quadrature modulator 102 for which predistortion is included. None of these elements is an actual circuit element which would be included in an actual implementation. In an actual circuit implementation, the representative elements are replaced with short circuits.

The imperfections modeled by the representative elements as well as the other circuit elements in the quadrature modulation block 102 operate the same way in transmit mode as they do in calibration mode. The imperfections modeled by the representative elements may vary as a function of time due to temperature changes and other environmental changes as well as aging. For this reason, the calibration process continues to be repeatedly executed during operation of the circuit.

The outputs of the D/A converters 122 and 124 are coupled to the representative summers 130 and 132, respectively. The undesirable D.C. offset for the I channel $a_i$ is summed with the I channel signal by the representative summer 130. The undesirable D.C. offset for the Q channel $a_q$ is summed with the Q channel signal by the representative summer 132. The outputs of the representative summers 130 and 132 are input into the representative gain amplifiers 134 and 136 respectively. The gain of the representative amplifier 134 is $g_i$. The gain of the representative amplifier 134 is $g_q$. In general, these gains are not equal to one another, thus, introducing a gain imbalance error into the modulator.

The outputs of the representative amplifiers 134 and 136 are coupled in the inputs of mixers 142 and 144, respectively. The local oscillator inputs of the mixers 142 and 144 are driven by a local oscillator generation unit 138. The actual frequency that the local oscillator produces depends on how the quadrature modulator is used in the actual transmitter circuitry. In one embodiment, the frequency of the local oscillator is an intermediate frequency (IF). In another embodiment, the frequency of the local oscillator is the actual RF center frequency of transmission. In yet another embodiment, the frequency of the local oscillator is programmable and may be assigned a different frequency in calibration mode than in transmit mode.

The representative phase shifter 140 illustrates the phase imbalance between the I and Q channel and is also representative of the effects of crosstalk in the system. The outputs of the mixers 142 and 144 are summed together in a summer 148. The output of the quadrature modulation block 102 is a signal at RF or IF which is the sum of the I and Q channel signals.

In transmit mode, a switch 154 within the AM detection block 104 is set to the A position and the combined I and Q channel signal is passed to the next transmission stage (not shown). For example, in one embodiment, in transmit mode, the AM detection block 104 routes the analog signal produced by the quadrature modulation block 102 to an upconversion stage or to a power amplifier.

In calibration mode, the switch 154 is set to the B position so that the output of the quadrature modulation block 102 is coupled to an AM detector 156. In one embodiment, the AM detector 156 squares the input signal which essentially moves the spectrum of the signal to baseband. The AM detector 156 may be replaced with other well-known circuit elements which translate an RF signal to a lower frequency signal.

In calibration mode, any energy component which appears at the input of the AM detection block 104 at the frequency of the local oscillator minus $f_{cal}$ is present at $2*f_{cal}$ at the input to the parameter determination block 106. Any local oscillator leakage component caused by D.C. imbalance which appears at the input of the AM detection block 104 at the frequency of the local oscillator is now present at $f_{cal}$ at the input to the parameter determination block 106. Any energy component caused by intermodulation nonlinearities which appears at the input of the AM detection block 104 at the third harmonic frequency is present at $f_{cal}$ at the input to the parameter determination block 106.

Within the parameter determination block 106, a low-pass filter 160 filters the incoming signal. An analog-to-digital (A/D) converter 162 converts the analog signal to a digital signal. A Fast Fourier Transform (FFT) 164 produces a digital spectral representation of the signal. In an alternative embodiment, the FFT 164 can be replaced with a Discrete Fourier Transform (DFT) or any other mechanism which produces a digital representation of the spectrum of the signal.

The quadratic polynomial minimization (QPM) calculator 166 executes the QPM algorithm. The QPM calculator 166 determines updated values for the predistortion parameters ($b_q$, $G_q$, $b_i$ and K) used in block 100 during transmission mode based upon the data collected during calibration mode. One exemplary embodiment of the operation of the QPM calculator 166 is described in detail below with relation to FIG. 3. The QPM calculator 166 outputs the predistortion parameters to the corresponding circuit element in the digital predistortion block 100, thus, completing the calibration feedback loop.

When an installed unit is operating in the field, routine operation is interrupted to enter a calibration mode. As noted above, in a TDMA system, calibration mode can be entered between transmission slots. In a TDMA, FDMA or CDMA or other type of system, calibration mode can be entered during a natural period of idleness which occurs between the transmission bursts. If the length of the period of idleness does not allow sufficient time for the collection of a sufficient amount of data for execution of the calibration process, the collection of data can be executed over a series of disjoint periods of calibration. Alternatively, transmission of data can be interrupted or suspended in order to accommodate the calibration process. Subsequent to data collection, the actual determination process may continue as the circuit re-enters transmission mode.

Typically, the QPM calculator 166 is implemented in software running on a digital signal processor (DSP) or is embodied in hardware such as in a field programmable gate array (FPGA) or in an application specific integrated circuit (ASIC). In one embodiment, the QPM calculator 166 comprises a series of processes that when executed perform the steps shown in FIG. 3. No matter what media and mode is selected to implement the invention, in order to reduce the cost, the operation of the QPM calculator should be simple and short. The operation detailed in FIG. 3 satisfies these requirements.

The operation of the QPM calculator 166 is an iterative process although in actual practice the invention often converges with one iteration. Each iteration of the process consists of two distinctive substages. Each substage requires a set of three measurements of energies, each measurement corresponding to a set of predistortion parameters. Each measurement is implemented by feeding a sinusoidal calibration signal with a frequency of $f_{cal}$ into the digital predistortion block 100 and collecting a set of signals output by the AM detection block 104 over a predetermined period of time. In a typical embodiment, the period of time for sample collection is an integer multiple of the period of $f_{cal}$ where the integer multiple is on the order of 4 to 10. In one embodiment, the sample sets are stored in a buffer for subsequent processing in non-real time. In another embodiment, if there are sufficient central processing unit resources available, the samples are processed in real time.

In general, the energy at $f_{cal}$ is affected by changes in $b_i$ and $b_q$ while the energy at $f_{cal}$ is not significantly affected by changes in $G_q$ and K. Likewise, in general, the energy at $f_{2cal}$ is affected by changes in $G_q$ and K while the energy at $f_{2cal}$ is not significantly affected by changes in $b_i$ and $b_q$. Thus, in general, in each set of measurements, one of the parameters varies the energy at $f_{cal}$ and one of the parameters varies the energy at $f_{2cal}$. Sets of three calibration measurements are performed. Within each set, one parameter affecting the energy at $f_{cal}$ and one parameter affecting the energy at $f_{2cal}$ are varied. For illustration purposes, the example that follows groups $b_q$ with $G_q$ and K with $b_i$. The resulting three sets of measurements for the first and second substage are shown in Table I and Table II, respectively.

TABLE I

| | $G_q$ | $b_q$ | K | $b_i$ |
|---|---|---|---|---|
| Set 1 | $G_q(n) - \Delta G_q = x_1^{2fcal}$ | $b_q(n) - \Delta b_q = x_1^{fcal}$ | K(n) | $b_i(n)$ |
| Set 2 | $G_q(n) = x_2^{2fcal}$ | $b_q(n) = x_2^{fcal}$ | K(n) | $b_i(n)$ |
| Set 3 | $G_q(n) + \Delta G_q = x_3^{2fcal}$ | $b_q(n) + \Delta b_q = x_3^{fcal}$ | K(n) | $b_i(n)$ |

TABLE II

| | $G_q$ | $b_q$ | K | $b_i$ |
|---|---|---|---|---|
| Set 4 | $G_q(n+1)$ | $b_q(n+1)$ | $K(n) - \Delta K = x_4^{2fcal}$ | $b_i(n) - \Delta b_i = x_4^{fcal}$ |
| Set 5 | $G_q(n+1)$ | $b_q(n+1)$ | $K(n) = x_5^{2fcal}$ | $b_i(n) = x_5^{fcal}$ |
| Set 6 | $G_q(n+1)$ | $b_q(n+1)$ | $K(n) + \Delta K = x_6^{2fcal}$ | $b_i(n) + \Delta b_i = x_6^{fcal}$ |

The first time the iterative process is executed, the value of $G_q(n)$, $b_q(n)$, K(n) and $b_i(n)$ are set to an arbitrary value within a suitable range of uncertainty for these parameters. In one embodiment, the value of the predistortion parameter $G_q$ is initially set to unity and the value of the other parameters are initially set to 0. After an initial determination has been made, each time the iterative process is re-executed, the previous values of the predistortion parameters are used as a starting point. In a typical system, the changes in the imperfections of the quadrature modulator occur at such a slow rate that the previous values of the predistortion parameters are typically a suitable starting point for the determination of a new set of predistortion parameters. For each iteration of the first substage, step values $\Delta b_q$ and $\Delta G_q$ is selected corresponding to $b_q$ and $G_q$, respectively. The value of these parameters may decrease as the number of iterations increases. A typical value for $\Delta b_q$ is about 20% of the amplitude of the calibration signal and a typical value for $\Delta G_q$ is about 20% of the nominal gain of the corresponding gain compensation amplifier. Likewise, for the second substage, step values $\Delta b_i$ and $\Delta K$ must be chosen corresponding to $b_i$ and K, respectfully. A typical value for $\Delta K$ sets about a 10% crosstalk factor between the two channels (e.g. about 10% of the Q channel signal is cross fed into the I channel) and a typical value of $\Delta b_q$ is also about 20% of the amplitude of the calibration signal.

Figure 3:
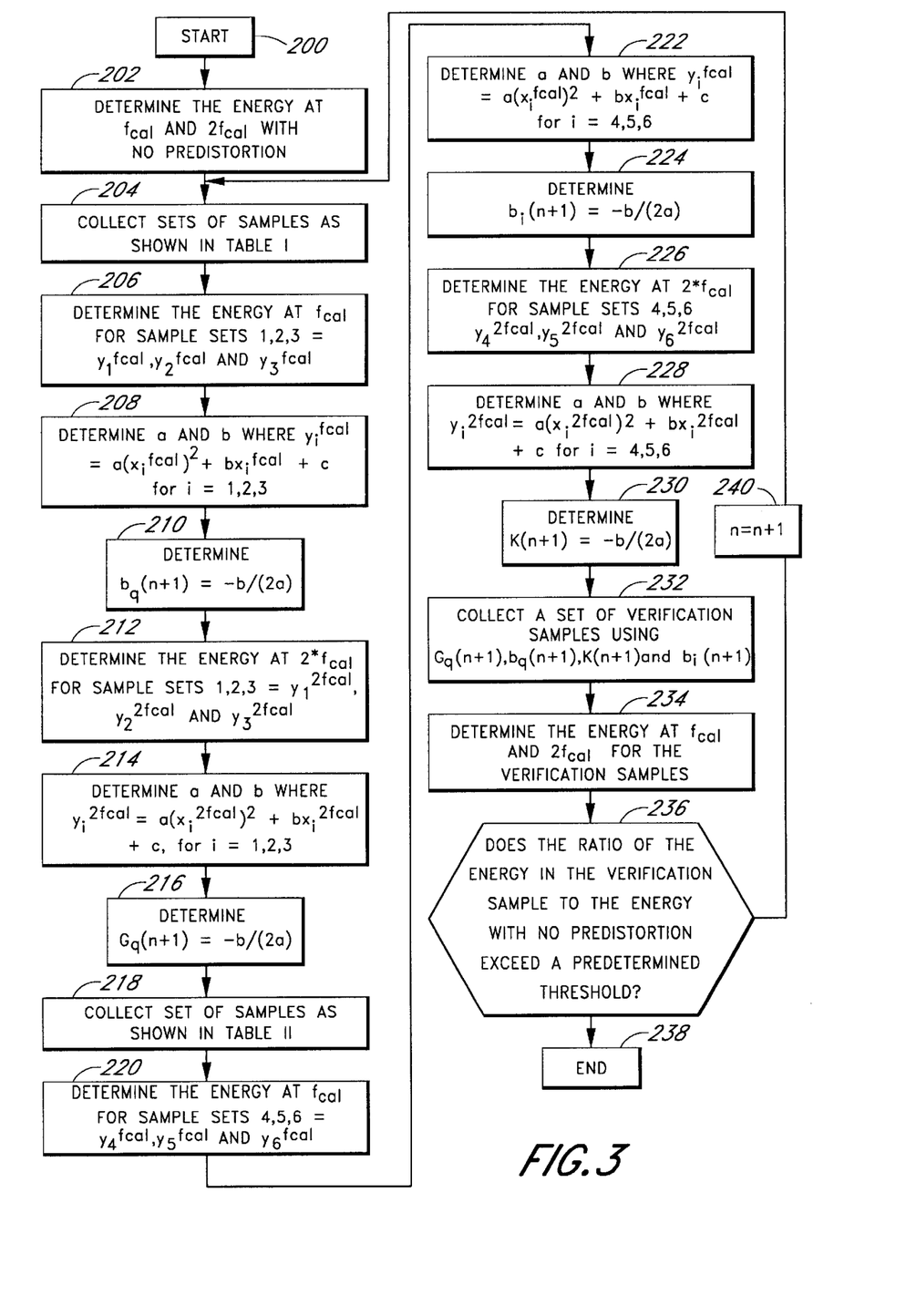
FIG. 3 is a flowchart showing the iterative process by which a set of predistortion parameters is selected.

Referring to FIG. 3, a description is presented of the iterative process by which a set of predistortion parameters is determined based upon the essentially quadratic relationship between the predistortion parameter and the spurious energies generated by the imperfect quadrature modulator. FIG. 3 is exemplary and other variations which related the predistortion parameter to the spurious energies based upon a set of quadratic equations can be developed in accordance with these teachings.

The flowchart of FIG. 3 represents operation of the quadrature modulator in calibration mode, in general, although some of the steps which do not involve the collection of data may be also executed in transmission mode. The flow begins in start block 200. In block 202, a sinusoidal wave at frequency $f_{cal}$ is applied in digital form to the digital predistortion block 100 and a set of samples are collected with the predistortion parameters set at an initial value. For example, in one embodiment, the D.C. offset predistortion parameters, $b_i$ and $b_q$, are set to zero, the gain imbalance predistortion parameter, G, is set to unity, and the crosstalk predistortion parameter, K, is set to zero such that no predistortion is provided. The energy output by the FFT 164 at $f_{cal}$ and $2*f_{cal}$ is determined and the values are stored for later reference.

In block 204, samples corresponding to three sets of predistortion parameters shown in Table I are collected. The first set of samples is collected with the predistortion parameter $G_q$ set equal to the previous value offset on the low side by the selected step value $\Delta G_q$. For notation purposes, we shall designate this value as $x_1^{2fcal}$ The predistortion parameter $b_q$ is set equal to the previous value offset on the low side by the selected step value $\Delta b_q$. The value of the predistortion parameter K and the predistortion parameter $b_i$ are each set equal to their respective previous value. For notation purposes, we shall designate this value as $x_1^{fcal}$.

For the second set of samples, all four predistortion parameters are set equal to their previous value. In one embodiment, during the first iteration, this data is the same as that which is collected in block 202 and that data can simply be re-used rather than re-derived from samples. For notation purposes, we shall refer to the previous value of the predistortion parameter $G_q(n)$ as $x_2^{2fcal}$ and the previous value of the predistortion parameter $b_q(n)$ as $x_2^{fcal}$.

The third set of samples is collected with the predistortion parameter $G_q$ set equal to the previous value offset on the high side by the selected step value $\Delta G_q$. For notation purposes, we shall refer to this value as $x_3^{2fcal}$. The predistortion parameter $b_q$ is offset on the high side by the selected step value $\Delta b_q$. For notation purposes, we shall refer to this value as $X_3^{fcal}$. The first three sets of samples are used in the first substage of the iterative process.

In block 206, the energy at $f_{cal}$ is determined for the first three sets of samples,. For notation purposes, we shall refer to the energy values as $y_1^{fcal}$, $y_2^{fcal}$, and $y_3^{fcal}$ for the sample sets 1, 2 and 3, respectively. In block 208, three quadratic equations are developed as shown in Equation 1 below, based upon the theory stated above that the energy at the spur frequencies is essentially a quadratic function of predistortion parameters.

$$y_i^{fcal}=a(x_i^{fcal})^2+bx_i^{fcal}+c \text{ for } i=1, 2 \text{ and } 3 \quad \text{Equation 1}$$

Also in block 208, the value of a and b are determined. For example, the formulas in Equations 2 and 3, below, may be used to solve for the value of a and b based upon the three quadratic equations given by Equation 1.

$$a=[y_1^{fcal}(x_2^{fcal}-x_3^{fcal})-y_2^{fcal}(x_1^{fcal}-x_3^{fcal})+y_3^{fcal}(x_1^{fcal}-x_2^{fcal})]/\text{Det} \quad \text{Equation 2}$$

$$b=[(x_1^{fcal})^2(y_2^{fcal}-y_3^{fcal})-(x_2^{fcal})^2(y_1^{fcal}-y_3^{fcal})+(x_3^{fcal})^2(y_1^{fcal}-y_2^{fcal})]/\text{Det} \quad \text{Equation 3}$$

where $$\text{Det}=(x_1^{fcal})^2(x_2^{fcal}-x_3^{fcal})-(x_2^{fcal})^2(x_1^{fcal}-x_3^{fcal})+(x_3^{fcal})^2(x_1^{fcal}-x_2^{fcal})$$

In block 210, the value of the predistortion parameter $b_q$ for the next iteration is determined as shown in Equation 4, where the minimum value of the polynomial $y^{fcal}$ occurs.

$$b_q(n+1)=-b/(2a) \quad \text{Equation 4}$$

Note that the determinant (Det) cancels out of Equation 4. Therefore, the value of the determinant does not have to be calculated in an actual implementation.

One principle upon which the invention operates is that a functional relationship exists between the spurious energy at $f_{cal}$ and the value of the predistortion parameter $b_q$. Stated another way, a value of the predistortion parameter $b_q$ exists for which the associated energy at $f_{cal}$ is a minimum. The same is true for predistortion parameter $b_i$. In a similar manner, a value of the predistortion parameters $G_q$, exists for which the associated energy at $f_{2cal}$ is a minimum. The same is true of the predistortion parameter K.

Still using the first three sets of samples, in block 212, the energy at $2*f_{cal}$ is determined. For notation purposes, we shall refer to the energy values as $y_1^{2fcal}$, $y_2^{2fcal}$, and $y_3^{2fcal}$ for the sample sets 1, 2 and 3, respectively. In block 214, three quadratic equations are developed as shown in Equation 5.

$$y_i^{2fcal}=a(x_i^{2fcal})^2+bx_i^{2fcal}+c \text{ for } i=1, 2 \text{ and } 3 \quad \text{Equation 5}$$

In block 216, the value of a and b are determined. For example, the formulas given in Equations 6 and 7 may be used to solve for the value of a and b based upon the three quadratic equations given by Equation 5.

$$a=[y_1^{2fcal}(x_2^{2fcal}-x_3^{2fcal})-y_2^{2fcal}(x_1^{2fcal}-x_3^{2fcal})+y_3^{2fcal}(x_1^{2fcal}-x_2^{2fcal})]/\text{Det} \quad \text{Equation 6}$$

$$b=[(x_1^{2fcal})^2(y_2^{2fcal}-y_3^{2fcal})-(x_2^{2fcal})^2(y_1^{2fcal}-y_3^{2fcal})+(x_3^{2fcal})^2(y_1^{2fcal}-y_2^{2fcal})]/\text{Det} \quad \text{Equation 7}$$

where $$\text{Det}=(x_1^{2fcal})^2(x_2^{2fcal}-x_3^{2fcal})-(x_2^{2fcal})^2(x_1^{2fcal}-x_3^{2fcal})+(x_3^{2fcal})^2(x_1^{2fcal}-x_2^{2fcal})$$

In block 216, the value of the predistortion parameter $G_q$ for the next iteration is determined as shown in Equation 8 where the minimum of the polynomial $y^{2fcal}$ occurs.

$$G_q(n+1)=-b/(2a) \quad \text{Equation 8}$$

Note that the determinant (Det) cancels out of Equation 8. Therefore, the value of the determinant does not have to be calculated in an actual implementation.

In block 218, the predistortion parameters $b_q$ and $G_q$ for the next iteration are used to collect the fourth, fifth and sixth set of samples. The fourth set of samples is collected with the value of the predistortion parameter K set equal to the previous value offset on the low side by the selected step value $\Delta K$. For notation purposes, we shall refer to this value as $x_4^{2fcal}$. The fourth set of samples is also collected with the predistortion parameter $b_i$ equal to the previous value offset on the low side by the selected step value $\Delta b_i$. For notation purposes, we shall refer to this value as $x_4^{2fcal}$. The fifth set of samples is collected by setting each of the predistortion parameters K and $b_i$ equal to their previous values. For notation purposes, we shall refer to the previous value of the predistortion parameter K(n) as $x_5^{2fcal}$ and the previous value of the predistortion parameter $b_i(n)$ as $x_5^{fcal}$. The sixth set of samples is collected with the predistortion parameter K set equal to its previous value offset on the high side by the selected step value $\Delta K$. The sixth set of samples is also collected by setting the predistortion parameter $b_i$ equal to the previous value offset on the high side by the selected step value $\Delta b_i$. For the ease of notation, we shall refer to these values as $x_6^{2fcal}$ and $x_6^{fcal}$, respectively.

For the second three sets of samples, in block 220, the energy at $f_{cal}$ is determined. For notation purposes, we shall refer to each of the energy values as $y_4^{fcal}$, $y_5^{cal}$, and $y_6^{fcal}$ for sample sets 4, 5 and 6, respectively. In block 222, three quadratic equations are developed as shown below in Equation 9.

$$y_i^{fcal} = a(x_i^{fcal})^2 + bx_i^{fcal} + c \text{ for } i=4, 5 \text{ and } 6 \qquad \text{Equation 9}$$

Also in block 222, the value of a and b are determined. For example, the formulas given below in Equations 10 and 11 may be used to solve for the value of a and b based upon the three quadratic equations given by Equation 9.

$$a=[y_4^{fcal}(x_5^{fcal}-x_6^{fcal})-y_5^{fcal}(x_4^{fcal}-x_6^{fcal})+y_6^{fcal}(x_4^{fcal}-x_5^{fcal})]/\text{Det} \qquad \text{Equation 10}$$

$$b=[(x_4^{fcal})^2(y_5^{fcal}-y_6^{fcal})-(x_5^{fcal})^2(y_4^{fcal}-y_6^{fcal})+(x_6^{fcal})^2(y_4^{fcal}-y_5^{fcal})]/\text{Det} \qquad \text{Equation 11}$$

where $$\text{Det}=(x_4^{fcal})^2(x_5^{fcal}-x_6^{fcal})-(x_5^{fcal})^2(x_4^{fcal}-x_6^{fcal})+(x_6^{fcal})^2(x_4^{fcal}-x_5^{fcal})$$

In block 224, the value of the predistortion parameter $b_i$ for the next iteration is determined as shown in Equation 12 where the minimum value of the polynomial $y^{fcal}$ occurs.

$$b_i(n+1)=-b/(2a) \qquad \text{Equation 12}$$

Note that the determinant (Det) cancels out of Equation 12. Therefore, the value of the determinant does not have to be calculated in an actual implementation.

Using the second three sets of samples, in block 226, the energy at $2*f_{cal}$, is determined. For notation purposes, we shall refer to the energy values as $y_4^{2fcal}$, $y_5^{2fcal}$, and $y_6^{2fcal}$ for sample sets 4, 5 and 6, respectively. In block 228, three quadratic equations are developed as shown in Equation 13.

$$y_i^{2fcal} = a(x_i^{2fcal})^2 + bx_i^{2fcal} + c \text{ for } i=4, 5 \text{ and } 6 \qquad \text{Equation 13}$$

Also, in block 228, the value of a and b are determined. For example, the formulas given in Equations 14 and 15 may be used to solve for the value of a and b based upon the three quadratic equations given by Equation 13.

$$a=[y_4^{2fcal}(x_5^{2fcal}-x_6^{2fcal})-y_5^{2fcal}(x_4^{2fcal}-x_6^{2fcal})+y_6^{2fcal}(x_4^{2fcal}-x_5^{2fcal})]/\text{Det} \qquad \text{Equation 14}$$

$$b=[(x_4^{2fcal})^2(y_5^{2fcal}-y_6^{2fcal})-(x_5^{2fcal})^2(y_4^{2fcal}-y_6^{2fcal})+(x_6^{2fcal})^2(y_4^{2fcal}-y_5^{2fcal})]/\text{Det} \qquad \text{Equation 15}$$

where $$\text{Det}=(x_4^{2fcal})^2(x_5^{2fcal}-x_6^{2fcal})-(x_5^{2fcal})^2(x_4^{2fcal}-x_6^{2fcal})+(x_6^{2fcal})^2(x_4^{2fcal}-x_5^{2fcal})$$

In block 228, the value of the crosstalk gain for the next iteration is determined as shown in Equation 16 where the minimum of the polynomial $y^{2fcal}$ occurs.

$$K(n+1)=-b/(2a) \qquad \text{Equation 16}$$

Note that the determinant (Det) cancels out of Equation 16. Therefore, the value of the determinant does not have to be calculated in an actual implementation.

In block 232, another set of samples is collected using the newly determined predistortion values, $b_q(n+1)$, $G_q(n+1)$, $q_i(n+1)$ and $K(n+1)$. In block 232, the energy at $f_{cal}$ and $2*f_{cal}$ corresponding to the verification samples is determined. Block 234 determines whether the ratio of the energy verification samples to the energy with no predistortion exceeds a predetermined threshold. If so, the new predistortion values are deemed sufficient to be used and are applied during subsequent transmission mode operation. Flow terminates in block 238. If in block 234 it is found that the ratio does not exceed the predetermined threshold, the flow process continues back to block 240 where the value of n is incremented. In an alternative embodiment, the values of $\Delta b_q$, $\Delta G_q$, $\Delta b_i$ and $\Delta K$ are also changed, typically to smaller values, in block 240. From block 240, flow continues back to block 204 where a subsequent iteration is executed.

In comparison with the prior art, the invention is robust because the quadratic polynomial minimization algorithm finds the value of the predistortion parameters which minimize the energy at the corresponding frequency. In contract, using a binary search method, if the initial estimate of the range of uncertainty does not include the value which corresponds to the minimum, the method does not return the exact value of the predistortion parameter which minimizes the energy. The invention typically converges within a single iteration while binary search methods may require a substantial number iterations..

Upon examination of the information herein, a myriad of alternative embodiments will be made readily available to one skilled in the art including the simple rearrangement of steps. For example, in one embodiment, the determination of the energy at $f_{cal}$ and $2*f_{cal}$ may be accomplished simultaneously such that the processes shown in blocks 206 and 212 are performed at once. The parameters may be interchanged. For example, the predistortion parameter G can operate on the I channel. The grouping of the predistortion parameter can be varied such that the predistortion parameter $b_q$ is varied at the same time as the predistortion parameter K. In one embodiment, a waveform which comprises a sinusoidal component as well as other components may be applied during calibration mode. For example, a square-wave may be applied at frequency $f_{cal}$.

In one embodiment, the samples collected in block 232 of FIG. 3 are the same some of the samples collected in block 204 during a subsequent iteration and the corresponding energy values are re-used rather than re-taken. The general principles of the invention may be combined with a variety of different convergence detection techniques. In FIG. 3, convergence is detected by comparison of the spurious energies produced using the current values of the predistortion parameters with an initial spurious energy measurement. In alternative embodiments, convergence may be determined based upon the number of iterations which have been completed, the absolute level of the spurious energy, the change in the spurious energy between the last two iterations or a variety of other ways.

Although the invention was described with respect to a direct conversion quadrature modulator, the teachings may be directly applied to other quadrature modulators such as those employing multiple conversion stages. In addition, the teachings of the invention may be extended to higher order spurious energy.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of determining a set of predistortion parameters for use with a quadrature modulator comprising the steps of:

(a) applying a sinusoidal wave to said quadrature modulator at a frequency $f_{cal}$;

(b) collecting a first series of sets of samples reflecting changes to the value of a first set of predistortion parameters;

(c) identifying a first series of energy values output by said quadrature modulator at said frequency $f_{cal}$ and the frequency $2*f_{cal}$, each of said series of energy values corresponding to one of said sets of samples; and (d) determining a subsequent value of said first set of predistortion parameters based upon a quadratic relationship between the value of said first set of predistortion parameters and said first series of energy values.

2. The method of claim 1, further comprising the steps of:

(e) collecting a second series of sets of samples reflecting changes to the value of a second set of predistortion parameters;

(f) identifying a second series of energy values output by said quadrature modulator at said frequency $f_{cal}$ and said frequency $2*f_{cal}$, each of said series of energy values corresponding to one of said sets of samples; and (g) determining a subsequent value of said second set of predistortion parameters based upon a quadratic relationship between the value of said second set of predistortion parameters and said second series of energy values.

3. The method of claim 2, wherein the steps (b)–(g) are iteratively repeated until said first and second set of predistortion parameters converge.

4. A method of determining a set of predistortion parameters for use in a predistortion block which drives an imperfect quadrature modulator in which a predistortion parameter, $b_i$, which determines a D.C. offset adjustment to an I channel, a predistortion parameter, $b_q$, which determines a D.C. offset adjustment to an Q channel, a predistortion parameter, K, which determines a cross talk gain between said I channel and said Q channel, and a predistortion parameter, G, which determines a gain offset adjustment between said I channel and said Q channel, the method comprising the steps of:

applying a sinusoidal wave at frequency $f_{cal}$ to said predistortion block;

collecting a first set of samples of an output of said imperfect quadrature modulator corresponding to setting said predistortion parameter, G, to a lower value than a previous G value equal to $x_1^{2fcal}$, a first one of said predistortion parameters which determine said D.C. offset to a lower value than a previous $b_1$ value equal to $x_1^{fcal}$, setting said predistortion parameter, K, to a previous K value and a second one of said predistortion parameters which determines said D.C. offset to a previous $b_2$ value;

determining an energy level at the frequency $f_{cal}$ and the frequency $2f_{cal}$ for said first set of samples equal to $y_1^{fcal}$ and $y_1^{2fcal}$, respectively;

collecting a second set of samples corresponding to setting said predistortion parameter, G, to said previous G value equal to $x_2^{2fcal}$, said first one of said predistortion parameters which determine said D.C. offset to said previous $b_1$ value equal to $x_2^{fcal}$, said predistortion parameter, K, to said previous K value and said second one of said predistortion parameters which determines said D.C. offset to said previous $b_2$ value;

determining an energy level at the frequency $f_{cal}$ and the frequency $2f_{cal}$ for said second set of samples equal to $y_2^{fcal}$ and $y_2^{2fcal}$, respectively;

collecting a third set of samples corresponding to setting said predistortion parameter, G, to a higher value than said previous G value equal to $x_3^{2fcal}$, said first one of said predistortion parameters which determine said D.C. offset to a higher value than said previous $b_1$ value equal to $x_3^{fcal}$, said predistortion parameter, K, to said previous K value and said second one of said predistortion parameters which determines said D.C. offset to said previous $b_2$ value;

determining an energy level at the frequency $f_{cal}$ and the frequency $2fcal$ for said third set of samples equal to $y_3^{fcal}$ and $y_3^{fcal}$, respectively;

determining a subsequent value of said predistortion parameter, G, based upon a quadratic relationship between said energy level $y_1^{2fcal}$ and said value $x_1^{2fcal}$, between said energy level $y_2^{2fcal}$ and said value $x_2^{2fcal}$ and between said energy level $y_3^{2fcal}$ and said value $x_3^{2fcal}$;

determining a subsequent value of said first one of said predistortion parameters which determine said D.C. offset based upon a quadratic relationship between said energy level $y_1^{fcal}$ and said value $x_1^{fcal}$, between said energy level $y_2^{fcal}$ and said value $x_2^{fcal}$ and between said energy level $y_3^{fcal}$ and said value $x_3^{fcal}$;

collecting a fourth set of samples of an output of said imperfect quadrature modulator corresponding to setting said predistortion parameter, K, to a lower value than a previous K value equal to $x_4^{2fcal}$, a second one of said predistortion parameters which determine said D.C. offset to a lower value than a previous $b_2$ value equal to $x_4^{cal}$, setting said predistortion parameter, G, to said subsequent value thereof and said first one of said predistortion parameters which determines said D.C. offset to said subsequent value thereof;

determining an energy level at the frequency $f_{cal}$ and the frequency $2f_{cal}$ for said fourth set of samples equal to $y_4^{fcal}$ and $y_4^{2fcal}$, respectively;

collecting a fifth set of samples corresponding to setting predistortion parameter, K, to said previous K value equal to $x_5^{2fcal}$, said second one of said predistortion parameters which determine said D.C. offset to said previous $b_2$ value equal to $x_5^{cal}$, said predistortion parameter, G, to said subsequent value thereof and said first one of said predistortion parameters which determines said D.C. offset to said subsequent value thereof, determining an energy level at the frequency $f_{cal}$ and the frequency $2f_{cal}$ for said fifth set of samples equal to $y_5^{cal}$ and $y_5^{2fcal}$, respectively;

collecting a sixth set of samples corresponding to setting said predistortion parameter, K, to a higher value than said previous K value equal to $x_6^{2fcal}$, said second one of said predistortion parameters which determine said D.C. offset to a higher value than said previous $b_2$ value equal to $x_6^{fcal}$, said predistortion parameter, G, to said subsequent value thereof and said first one of said predistortion parameters which determines said D.C. offset to said subsequent value thereof;

determining an energy level at the frequency $f_{cal}$ and the frequency $2f_{cal}$ for said sixth set of samples equal to $y_6^{fcal}$ and $y_6^{2fcal}$, respectively;

determining a subsequent value of said predistortion parameter, K, based upon a quadratic relationship between said energy level $y_4^{2fcal}$ and said value $x_5^{2fcal}$, between said energy level $y_5^{2fcal}$ and said value $x_5^{2fcal}$ and between said energy level $y_6^{2fcal}$ and said value $x_6^{2fcal}$; and determining a subsequent value of said second one of said predistortion parameters which determine said D.C. offset based upon a quadratic relationship between said energy level $y_4^{cal}$ and said value $x_4^{cal}$, between said energy level $y_5^{cal}$ and said value $x_5^{cal}$ and between said energy level $y_6^{fcal}$ and said value $x_6^{fcal}$.

5. A method of determining a set of predistortion parameters for use in predistortion block which drives an imperfect quadrature modulator in which a predistortion parameter, $b_i$, which determines a D.C. offset adjustment to an I channel, a predistortion parameter, $b_q$, which determines a D.C. offset adjustment to a Q channel, a predistortion parameter, K, which determines a cross talk gain between said I channel and said Q channel, and a predistortion parameter, G, which determines a gain offset adjustment between said I channel and said Q channel, said method comprising the steps of:

applying a sinusoidal wave at frequency $f_{cal}$ to said predistortion block;

setting said predistortion parameter, G, equal to a previous value, G(n), offset on the low side by the selected step value $\Delta G$ wherein $G(n) - \Delta G = x^{12fcal}$;

setting said predistortion parameter, $b_q$, equal to a previous value, $b_q(n)$, offset on the low side by the selected step value $\Delta b_q$ wherein $b_q(n) - \Delta b_q = x_1^{fcal}$;

setting said predistortion parameter, K, equal to a previous value, K(n);

setting said predistortion parameter, $b_i$, equal to a previous value, $b_i(n)$;

collecting a first set of samples of an output of said imperfect quadrature modulator and determining an energy level at the frequency $f_{cal}$ and the frequency $2f_{cal}$ for said first set of samples equal to $y_1^{fcal}$ and $y_1^{2fcal}$, respectively;

setting said predistortion parameter, G, equal to said previous value, $G(n)=x_2^{2fcal}$;

setting said predistortion parameter, $b_q$, equal to said previous value, $b_q(n)=x_2^{2fcal}$;

collecting a second set of samples of said output of said imperfect quadrature modulator and determining an energy level at the frequency $f_{cal}$ and the frequency $2f_{cal}$, for said second set of samples equal to $y_2^{fcal}$ and $y_2^{2fcal}$, respectively;

setting said predistortion parameter, G, equal to said previous value, G(n), offset on the high side by the selected step value $\Delta G$ wherein $G(n)+\Delta G=x_3^{2fcal}$;

setting said predistortion parameter, $b_q$, equal to said previous value, $b_q(n)$, offset on the high side by the selected step value $\Delta b_q$ wherein $b_q(n)+\Delta b_q=x_3^{fcal}$;

collecting a third set of samples of said output of said imperfect quadrature modulator and determining an energy level at the frequency $f_{cal}$ and the frequency $2f_{cal}$ for said third set of samples equal to $y_3^{fcal}$ and $y_{32fcal}$, respectively;

determining a subsequent value of said predistortion parameter, $b_q$, equal to $b_q(n+1)$ by solving $$b_q(n+1) = -b/(2a)$$

where $$y_i^{fcal} = a(x_i^{fcal})^2 + bx_i^{fcal} + c \text{ for } i=1,2 \text{ and } 3;$$

determining a subsequent value of said predistortion parameter, G, equal to G(n+1) by solving $$G(n+1) = -b/(2a)$$

where $$y_i^{2fcal} = a(x_i^{2fcal})^2 + bx_i^{2fcal} = c \text{ for } i=1,2 \text{ and } 3$$

setting said predistortion parameter, G, equal to said next value, G(n+1);

setting said predistortion parameter, $b_q$, equal to said next value, $b_q(n+1)$;

setting said predistortion parameter, K, equal to said previous value, K(n) offset on the low side by the selected step value $\Delta K$ wherein $K(n)-\Delta K=x_4^{2fcal}$;

setting said predistortion parameter, $b_i$, equal to said previous value, $b_i(n)$ offset on the low side by the selected step value $\Delta b_i$ wherein $b_i(n)-\Delta b_i=x_4^{fcal}$;

collecting a fourth set of samples of said output of said imperfect quadrature modulator and determining an energy level at the frequency $f_{cal}$ and the frequency $2f_{cal}$ for said fourth set of samples equal to $y_4^{fcal}$ and $y_4^{2fcal}$, respectively;

setting said predistortion parameter, K, equal to said previous value, $K(n)=x_5^{2fcal}$;

setting said predistortion parameter, $b_i$, equal to said previous value, $b_i(n)=x_5^{fcal}$;

collecting a fifth set of samples of said output of said imperfect quadrature modulator and determining an energy level at the frequency $f_{cal}$ and the frequency $2_{fcal}$ for said fifth set of samples equal to $y_5^{fcal}$ and $y_5^{2fcal}$, respectively;

setting said predistortion parameter, K, equal to said previous value, K(n), offset on the high side by the selected step value $\Delta K$ wherein $K(n)+\Delta K=x_6^{2fcal}$;

setting said predistortion parameter, $b_i$, equal to said previous value, $b_i(n)$, offset on the high side by the selected step value $\Delta b_i$ wherein $b_i(n)+\Delta b_i=x_6^{fcal}$;

collecting a sixth set of samples of said output of said imperfect quadrature modulator and determining an energy level at the frequency $f_{cal}$ and the frequency $2f_{cal}$ for said sixth set of samples equal to $y_6^{fcal}$ and $y_6^{2fcal}$, respectively;

determining a subsequent value of said predistortion parameter, $b_i$, equal to $b_i(n+1)$ by solving $$b_i(n+1) = -b/(2a)$$

where $$y_i^{fcal} = a(x_i^{fcal})^2 + bx_i^{fcal} + c \text{ for } i=4, 5 \text{ and } 6;$$

and determining a subsequent value of said predistortion parameter, K, equal to K(n+1) by solving $$K(n+1) = -b/(2a)$$

where $$y_i^{fcal} = a(x_i^{fcal})^2 + bx_i^{2fcal} + c \text{ for } i=4, 5 \text{ and } 6.$$

6. The method of determining said set of predistortion parameters of claim 5, wherein said imperfect quadrature modulator is a direct conversion modulator.

7. The method of determining said set of predistortion parameters of claim 5, wherein said step of applying a sinusoidal wave at frequency $f_{cal}$ to said predistortion block and said steps of collecting said first, second, third, fourth, fifth and sixth sample sets occur during a calibration mode and wherein said steps of determining said energy levels at the frequency $f_{cal}$ and the frequency $2f_{cal}$ and said determining said subsequent values occur during said calibration mode or during a transmit mode.

8. The method of determining said set of predistortion parameters of claim 5, further comprising the steps of:

setting said predistortion parameter, G, equal to said next value, G(n+1);

setting said predistortion parameter, $b_q$, equal to said next value, $b_q(n+1)$;

setting said predistortion parameter, K, equal to said next value, K(n+1);

setting said predistortion parameter, $b_i$, equal to said next value, $b_i(n+1)$;

collecting a seventh set of samples of said output of said imperfect quadrature modulator and determining an energy level at the frequency $f_{cal}$ and the frequency $2f_{cal}$;

comparing said energy values at the frequency $f_{cal}$ and the frequency $2f_{cal}$ to previously collected energy values at the frequency $f_{cal}$ and the frequency $2f_{cal}$; and setting said previous values equal to said subsequent values and repeating said steps of collecting samples and determining said subsequent values if a difference between said energy values and said previously collected set of energy values is less than a predetermined value.

9. An apparatus for determining a set of predistortion parameters for use in a predistortion block which drives an imperfect quadrature modulator in which a predistortion parameter, $b_i$, which determines a D.C. offset adjustment to an I channel, a predistortion parameter, $b_q$, which determines a D.C. offset adjustment to an Q channel, a predistortion parameter, K, which determines a cross talk gain between said I channel and said Q channel, and a predistortion parameter, G, which determines a gain offset adjustment between said I channel and said Q channel, the apparatus comprising:

means for applying a sinusoidal wave at frequency $f_{cal}$ to said predistortion block;

means for collecting a first set of samples of an output of said imperfect quadrature modulator corresponding to setting said predistortion parameter, G, to a lower value than a previous G value equal to $x_1^{2fcal}$, a first one of said predistortion parameters which determine said D.C. offset to a lower value than a previous $b_1$ value equal to $x_1^{fcal}$, setting said predistortion parameter, K, to a previous K value and a second one of said predistortion parameters which determines said D.C. offset to a previous $b_2$ value;

means for determining an energy level at the frequency $f_{cal}$ and the frequency $2f_{cal}$ for said first set of samples equal to $y_1^{fcal}$ and $y_1^{2fcal}$, respectively;

means for collecting a second set of samples corresponding to setting said predistortion parameter, G, to said previous G value equal to $x_2^{2fcal}$, said first one of said predistortion parameters which determine said D.C. offset to said previous $b_1$ value equal to $x_2^{fcal}$, said predistortion parameter, K, to said previous K value and said second one of said predistortion parameters which determines said D.C. offset to said previous $b_2$ value;

means for determining an energy level at the frequency $f_{cal}$ and the frequency $2f_{cal}$ for said second set of samples equal to $y_2^{fcal}$ and $y_2^{2fcal}$, respectively;

means for collecting a third set of samples corresponding to setting said predistortion parameter, G, to a higher value than said previous G value equal to $x_3^{2fcal}$, said first one of said predistortion parameters which determine said D.C. offset to a higher value than said previous $b_1$ value equal to $x_3^{fcal}$, said predistortion parameter, K, to said previous K value and said second one of said predistortion parameters which determines said D.C. offset to said previous $b_2$ value;

means for determining an energy level at the frequency $f_{cal}$ and the frequency $2f^{cal}$ for said third set of samples equal to $y_3^{2fcal}$ and $y_3^{2fcal}$, respectively;

means for determining a subsequent value of said predistortion parameter, G, based upon a quadratic relationship between said energy level $y_1^{2fcal}$ and said value $x_1^{2fcal}$, between said energy level $y_2^{2fcal}$ and said value $x_2^{2fcal}$ and between said energy level $y_3^{2fcal}$ and said value $x_3^{2fcal}$;

means for determining a subsequent value of said first one of said predistortion parameters which determine said D.C. offset based upon a quadratic relationship between said energy level $y_1^{fcal}$ and said value $x_1^{fcal}$, between said energy level $y_2^{fcal}$ and said value $x_2^{fcal}$ and between said energy level $y_3^{fcal}$ and said value $x_3^{fcal}$;

means for collecting a fourth set of samples of an output of said imperfect quadrature modulator corresponding to setting said predistortion parameter, K, to a lower value than a previous K value equal to $x_4^{2fcal}$, a second one of said predistortion parameters which determine said D.C. offset to a lower value than a previous $b_2$ value equal to $x_4^{cal}$, setting said predistortion parameter, G, to said subsequent value thereof and said first one of said predistortion parameters which determines said D.C. offset to said subsequent value thereof;

means for determining an energy level at the frequency $f_{cal}$ and the frequency $2f_{cal}$ for said fourth set of samples equal to $y_4^{fcal}$ and $y_4^{2fcal}$, respectively;

means for collecting a fifth set of samples corresponding to setting predistortion parameter, K, to said previous K value equal to $x_4^{2fcal}$, said second one of said predistortion parameters which determine said D.C. offset to said previous $b_2$ value equal to $x_4^{cal}$, said predistortion parameter, G, to said subsequent value thereof and said first one of said predistortion parameters which determines said D.C. offset to said subsequent value thereof;

means for determining an energy level at the frequency $f_{cal}$ and the frequency $2f_{cal}$ for said fifth set of samples equal to $y_5^{cal}$ and $y_5^{2fcal}$, respectively;

means for collecting a sixth set of samples corresponding to setting said predistortion parameter, K, to a higher value than said previous K value equal to $x_6^{2fcal}$, said second one of said predistortion parameters which determine said D.C. offset to a higher value than said previous $b_2$ value equal to $x_6^{fcal}$, said predistortion parameter, G, to said subsequent value thereof and said first one of said predistortion parameters which determines said D.C. offset to said subsequent value thereof;

determining an energy level at the frequency $f_{cal}$ and the frequency $2f_{cal}$ for said sixth set of samples equal to $y_6^{fcal}$ and $y_6^{2fcal}$, respectively;

determining a subsequent value of said predistortion parameter, K, based upon a quadratic relationship between said energy level $y_4^{2fcal}$ and said value $x_4^{2fcal}$, between said energy level $y_5^{2fcal}$ and said value $x_5^{2fcal}$ and between said energy level $y_6^{2fcal}$ and said value $x_6^{2fcal}$; and determining a subsequent value of said second one of said predistortion parameters which determine said D.C. offset based upon a quadratic relationship between said energy level $y_4^{cal}$ and said value $x_4^{cal}$, between said energy level $y_5^{cal}$ and said value $x_5^{cal}$ and between said energy level $y_6^{fcal}$ and said value $x_6^{fcal}$.

10. A transmit modulator comprising:
- a predistortion block producing a predistorted output signal comprising:
  - a D.C. offset compensation summer which determines a D.C. offset adjustment to an I channel based upon a predistortion parameter, $b_i$;
  - a D.C. offset compensation summer which determines a D.C. offset adjustment to an Q channel based upon a predistortion parameter, $b_q$; <a cross talk amplifier which determines a cross talk gain between said I channel and said Q channel based upon a predistortion parameter, K; and
  - a gain compensation amplifier which determines a gain offset adjustment between said I channel and said Q channel based upon a predistortion parameter, G;
- an imperfect quadrature modulator coupled to said predistortion block and receiving said predistorted output signal and producing a modulated signal;
- a transformer coupled to said imperfect quadrature modulator and receiving said modulated signal and producing a digital representation of a spectrum of said modulated signal;
- a quadratic polynomial minimization calculator which determines a subsequent value of said predistortion parameters, $b_i$, $b_q$, K and G based upon a quadratic relationship between energies present in said digital representation of said spectrum of said modulated signal and the values of said predistortion parameter $b_i$, $b_q$, K and G.

11. The transmit modulator of claim 10 wherein said quadratic polynomial minimization calculator contains a series of processes that when executed perform the steps of:

collecting a first set of samples of an output of said imperfect quadrature modulator corresponding to setting said predistortion parameter, G, to a lower value than a previous G value equal to $x_1^{2fcal}$, a first one of said predistortion parameters which determine a D.C. offset to a lower value than a previous $b_1$ value equal to $x_1^{fcal}$, setting said predistortion parameter, K, to a previous K value and a second one of said predistortion parameters which determines a D.C. offset to a previous $b_2$ value;

determining an energy level at the frequency $f_{cal}$ and the frequency $2f_{cal}$ for said first set of samples equal to $y_1^{fcal}$ and $y_1^{2fcal}$, respectively;

collecting a second set of samples corresponding to setting said predistortion parameter, G, to said previous G value equal to $x_2^{2fcal}$, said first one of said predistortion parameters which determine said D.C. offset to said previous $b_1$ value equal to $x_2^{fcal}$, said predistortion parameter, K, to said previous K value and said second one of said predistortion parameters which determines said D.C. offset to said previous $b_2$ value;

determining an energy level at the frequency $f_{cal}$ and the frequency $2f_{cal}$ for said second set of samples equal to $y_2^{fcal}$ and $y_2^{2fcal}$, respectively;

collecting a third set of samples corresponding to setting said predistortion parameter, G, to a higher value than said previous G value equal to $x_3^{2fcal}$, said first one of said predistortion parameters which determine said D.C. offset to a higher value than said previous $b_1$ value equal to $x_3^{fcal}$, said predistortion parameter, K, to said previous K value and said second one of said predistortion parameters which determines a D.C. offset to said previous $b_2$ value;

determining an energy level at the frequency $f_{cal}$ and the frequency $2f_{cal}$ for said third set of samples equal to $y_3^{fcal}$ and $y_3^{2fcal}$, respectively;

determining a subsequent value of said predistortion parameter, G, based upon a quadratic relationship between said energy level $y_1^{2fcal}$ and said value $x_1^{2fcal}$, between said energy level $y_2^{2fcal}$ and said value $x_2^{2fcal}$ and between said energy level $y_3^{2fcal}$ and said value $x_3^{2fcal}$;

determining a subsequent value of said first one of said predistortion parameters which determine said D.C. offset based upon a quadratic relationship between said energy level $y_1^{fcal}$ and said value $x_1^{fcal}$, between said energy level $y_2^{fcal}$ and said value $x_2^{fcal}$ and between said energy level $y_3^{fcal}$ and said value $x_3^{fcal}$;

collecting a fourth set of samples of an output of said imperfect quadrature modulator corresponding to setting said predistortion parameter, K, to a lower value than a previous K value equal to $x_4^{2fcal}$, a second one of said predistortion parameters which determine said D.C. offset to a lower value than a previous $b_2$ value equal to $x_4^{cal}$, setting said predistortion parameter, G, to said subsequent value thereof and said first one of said predistortion parameters which determines a D.C. offset to said subsequent value thereof;

determining an energy level at the frequency $f_{cal}$ and the frequency $2f_{cal}$ for said fourth set of samples equal to $y_4^{fcal}$ and $y_4^{2fcal}$, respectively;

collecting a fifth set of samples corresponding to setting predistortion parameter, K, to said previous K value equal to $x_4^{2fcal}$, said second one of said predistortion parameters which determine said D.C. offset to said previous $b_2$ value equal to $x_4^{cal}$, said predistortion parameter, G, to said subsequent value thereof and said first one of said predistortion parameters which determines a D.C. offset to said subsequent value thereof;

determining an energy level at the frequency $f_{cal}$ and the frequency $2f_{cal}$ for said fifth set of samples equal to $y_5^{cal}$ and $y_5^{2fcal}$, respectively;

collecting a sixth set of samples corresponding to setting said predistortion parameter, K, to a higher value than said previous K value equal to $x_6^{2fcal}$, said second one of said predistortion parameters which determine said D.C. offset to a higher value than said previous $b_2$ value equal to $x_6^{fcal}$, said predistortion parameter, G, to said subsequent value thereof and said first one of said predistortion parameters which determines a D.C. offset to said subsequent value thereof;

determining an energy level at the frequency $f_{cal}$ and the frequency $2f_{cal}$ for said sixth set of samples equal to $y_6^{fcal}$ and $y_6^{2fcal}$, respectively;

determining a subsequent value of said predistortion parameter, K, based upon a quadratic relationship between said energy level $y_4^{2fcal}$ and said value $x_4^{2fcal}$, between said energy level $y_5^{2fcal}$ and said value $x_5^{2fcal}$ and between said energy level $y_6^{2fcal}$ and said value $x_6^{2fcal}$; and determining a subsequent value of said second one of said predistortion parameters which determine said D.C. offset based upon a quadratic relationship between said energy level $y_4^{cal}$ and said value $x_4^{cal}$, between said energy level $y_5^{cal}$ and said value $x_5^{cal}$ and between said energy level $y_6^{fcal}$ and said value $x_6^{fcal}$.

12. A programmed storage device storing a series of process that when executed perform a method of determining a set of predistortion parameters for use in a predistortion block which drives an imperfect quadrature modulator in which a predistortion parameter, $b_i$, which determines a D.C. offset adjustment to an I channel, a predistortion parameter, $b_q$, which determines a D.C. offset adjustment to an Q channel, a predistortion parameter, K, which determines a cross talk gain between said I channel and said Q channel, and a predistortion parameter, G, which determines a gain offset adjustment between said I channel and said Q channel, the method comprising the steps of:

applying a sinusoidal wave at frequency $f_{cal}$ to said predistortion block;

collecting a first set of samples of an output of said imperfect quadrature modulator corresponding to setting said predistortion parameter, G, to a lower value than a previous G value equal to $x_1^{2fcal}$ a first one of said predistortion parameters which determine said D.C. offset to a lower value than a previous $b_1$ value equal to $x_1^{fcal}$, setting said predistortion parameter, K, to a previous K value and a second one of said predistortion parameters which determines said D.C. offset to a previous $b_2$ value;

determining an energy level at the frequency $f_{cal}$ and the frequency $2f_{cal}$ for said first set of samples equal to $y_1^{fcal}$ and $y_1^{2fcal}$, respectively;

collecting a second set of samples corresponding to setting said predistortion parameter, G, to said previous G value equal to $x_2^{2fcal}$, said first one of said predistortion parameters which determine said D.C. offset to said previous $b_1$ value equal to $x_2^{fcal}$, said predistortion parameter, K, to said previous K value and said second one of said predistortion parameters which determines said D.C. offset to said previous $b_2$ value;

determining an energy level at the frequency $f_{cal}$ and the frequency $2f_{cal}$ for said second set of samples equal to $y_2^{fcal}$ and $y_2^{2fcal}$, respectively;

collecting a third set of samples corresponding to setting said predistortion parameter, G, to a higher value than said previous G value equal to $x_3^{2fcal}$, said first one of said predistortion parameters which determine said D.C. offset to a higher value than said previous $b_1$ value equal to $x_3^{fcal}$, said predistortion parameter, K, to said previous K value and said second one of said predistortion parameters which determines said D.C. offset to said previous $b_2$ value;

determining an energy level at the frequency $f_{cal}$ and the frequency $2f_{cal}$ for said third set of samples equal to $y_3^{fcal}$ and $y_3^{2fcal}$, respectively;

determining a subsequent value of said predistortion parameter, G, based upon a quadratic relationship between said energy level $y_1^{2fcal}$ and said value $x_1^{2fcal}$, between said energy level $y_2^{2fcal}$ and said value $x_2^{2fcal}$ and between said energy level $y_3^{2fcal}$ and said value $x_3^{2fcal}$;

determining a subsequent value of said first one of said predistortion parameters which determine said D.C. offset based upon a quadratic relationship between said energy level $y_1^{fcal}$ and said value $x_1^{fcal}$, between said energy level $y_2^{fcal}$ and said value $x_2^{fcal}$ and between said energy level $y_3^{fcal}$ and said value $x_3^{fcal}$;

collecting a fourth set of samples of an output of said imperfect quadrature modulator corresponding to setting said predistortion parameter, K, to a lower value than a previous K value equal to $x_4^{2fcal}$, a second one of said predistortion parameters which determine said D.C. offset to a lower value than a previous $b_2$ value equal to $x_4^{cal}$, setting said predistortion parameter, G, to said subsequent value thereof and said first one of said predistortion parameters which determines said D.C. offset to said subsequent value thereof;

determining an energy level at the frequency $f_{cal}$ and the frequency $2f_{cal}$ for said fourth set of samples equal to $y_4^{fcal}$ and $y_4^{2fcal}$, respectively;

collecting a fifth set of samples corresponding to setting predistortion parameter, K, to said previous K value equal to $x_4^{2fcal}$, said second one of said predistortion parameters which determine said D.C. offset to said previous $b_2$ value equal to $x_4^{cal}$, said predistortion parameter, G, to said subsequent value thereof and said first one of said predistortion parameters which determines said D.C. offset to said subsequent value thereof;

determining an energy level at the frequency $f_{cal}$ and the frequency $2f_{cal}$ for said fifth set of samples equal to $y_5^{cal}$ and $y_5^{2fcal}$, respectively;

collecting a sixth set of samples corresponding to setting said predistortion parameter, K, to a higher value than said previous K value equal to $x_6^{2fcal}$, said second one of said predistortion parameters which determine said D.C. offset to a higher value than said previous $b_2$ value equal to $x_6^{fcal}$, said predistortion parameter, G, to said subsequent value thereof and said first one of said predistortion parameters which determines said D.C. offset to said subsequent value thereof;

determining an energy level at the frequency $f_{cal}$ and the frequency $2f_{cal}$ for said sixth set of samples equal to $y_6^{fcal}$ and $y_6^{2fcal}$, respectively;

determining a subsequent value of said predistortion parameter, K, based upon a quadratic relationship between said energy level $y_4^{2fcal}$ and said value $x_4^{2fcal}$, between said energy level $y_5^{2fcal}$ and said value $x_5^{2fcal}$ and between said energy level $y_6^{2fcal}$ and said value $x_6^{2fcal}$; and determining a subsequent value of said second one of said predistortion parameters which determine said D.C. offset based upon a quadratic relationship between said energy level $y_4^{cal}$ and said value $x_4^{cal}$, between said energy level $y_5^{cal}$ and said value $x_5^{cal}$ and between said energy level $y_6^{fcal}$ and said value $x_6^{fcal}$.

* * * * *